United States Patent [19]

Yamamoto et al.

[11] 4,227,078

[45] Oct. 7, 1980

[54] PHOTO-SENSOR

[75] Inventors: Hideaki Yamamoto, Hachioji; Haruo Matsumaru, Hinodemachi; Makoto Matsui, Hachioji; Toshihisa Tsukada, Sekimachi; Tadaaki Hirai, Koganei; Eiichi Maruyama, Kodaira, all of Japan

[73] Assignees: Nippon Telegraph and Telephone Public Corporation, Japan; Hitachi, Ltd., Japan

[21] Appl. No.: 918,273

[22] Filed: Jun. 22, 1978

[30] Foreign Application Priority Data

Jun. 27, 1977 [JP] Japan .................................. 52-75593

[51] Int. Cl.² ................................................. G02B 5/14
[52] U.S. Cl. ..................................... 250/227; 235/473; 250/551
[58] Field of Search ................. 250/227, 551; 235/473

[56] References Cited

U.S. PATENT DOCUMENTS

| | | | |
|---|---|---|---|
| 3,524,986 | 8/1970 | Harnden | 250/227 X |
| 3,786,238 | 1/1974 | Heisner | 235/473 X |
| 3,879,606 | 4/1975 | Bean | 250/227 |
| 3,992,620 | 11/1976 | Waller | 250/227 X |

Primary Examiner—David. C. Nelms
Assistant Examiner—Darwin R. Hostetter
Attorney, Agent, or Firm—Craig & Antonelli

[57] ABSTRACT

A photo-sensor wherein a bundle of optical fibers in the form of a sheet is disposed within a predetermined substrate, the optical fiber bundle extending from a first surface to a second surface of the substrate, an array of photosensitive elements is disposed integrally with the substrate in such a manner that at least one transparent insulating layer intervenes between the photoelectric elements and the optical fiber bundle on, at least, an end face of the optical fiber bundle on the first surface side of the substrate, and an end face of the optical fiber bundle open to the second surface of the substrate serves as an information reading face.

22 Claims, 21 Drawing Figures

PHOTO-SENSOR

BACKGROUND OF THE INVENTION

1. Field of the Invention

This invention relates to a photo-sensor for reading information such as characters and patterns. The photo-sensor of this invention is especially useful when employed as image sensors for facsimile equipment, optical character recognition, etc.

2. Description of the Prior Art

Heretofore, a linear silicon photodiode array has been generally employed as the photosensitive elements of a facsimile transmitter, optical character recognition etc. Since, however, silicon is subject to limitations in the size of a producible single crystal and the processing technique, the length of the linear silicon photodiode array has a limit. At present, the length of the linear silicon photodiode array is only about 30 mm at the utmost. On the other hand, an original picture to be read has a width of, for example, 210 mm in the A4-size or format. Accordingly, in case of reading the original picture of the A4-size with the linear silicon photodiode array, the original picture is scaled down and imaged on the linear silicon photodiode array by the use of a lens system.

In case of using such a lens system, there are the disadvantages that the positioning of the lens requires much labor and that a degraded resolution of a peripheral part and an insufficient quantity of light arise.

Recently, it has been attempted to eliminate the disadvantages of such a lens system by employing optical fibers as an optical system.

An example of the attempt is described in detail in, for example, "Gazō Denshi Gakkai Shi (Bulletin of the Picture Electronics Society)," vol. 4, No. 2, pp. 54–61 (1975). Hereunder, the technique will be briefly explained.

FIG. 1 is a view showing the operating principle of the prior art. In the figure, numeral 1 designates an original picture, and numeral 2 denotes 1,280 optical fibers. One side of the optical fibers close to the original picture is in the form of a sheet, while the other side is distributed to 20 linear silicon photodiode arrays 3. The linear silicon photodiode array consists of 64 photodiodes. The photo-sensor having such a structure is meritorious over the photo-sensor employing the lens system in that the degradation of the resolution of the peripheral part and the insufficient quantity of light can be avoided, but it is not practical on account of disadvantages as listed below.

1. The optical fibers of the structure in which one side is in the form of the very thin sheet and the other side is distributed to the 20 linear silicon photodiode arrays, eventually need some extent of length. This is unfavorable for the miniaturization of the device. Moreover, there is a high possibility that the optical fibers will be broken by mechanical shocks such as vibrations.

2. Inasmuch as the optical fibers must be arrayed in perfect conformity with the pitch of the silicon photodiodes, fibers of high precision are required. The alignment takes much labor, and the position is prone to shift in the course of use.

3. In order to prevent the destruction of the linear silicon photodiode array, the optical fibers must be floated in use. This degrades the resolution drastically.

Further, the inventors have proposed a new photo-sensor as described hereunder. The photo-sensor is already the subject of a patent application in the United States.

FIGS. 2 and 3 show an example of the photo-sensor. FIG. 2 is a plan view of the example, while FIG. 3 is a side view thereof.

Referring to the figures, numeral 4 designates a bundle of optical fibers, and numeral 5 a plate of glass which can be readily bonded with the optical fiber bundle 4. Hereinafter, a plate which has a bundle of optical fibers buried in at least its inner part in this manner shall be termed "fiber substrate." Parts 6 are transparent stripe electrodes. Numeral 7 indicates a semiconductor layer, and numeral 8 an electrode made of a thin metal film. In this manner, a photodiode array which consists of the transparent stripe electrodes 6, the semiconductor layer 7 and the metallic electrode 8 is disposed directly on the fiber substrate.

However, in case of disposing the photodiode array directly on the fiber substrate, there are disadvantages as stated below. As is well known, the optical fiber has a structure wherein, as depicted in FIG. 4, a portion of high refractive index 9 called "core" is enveloped in a layer of low refractive index 10 termed "clad." The diameter of the optical fiber to be used is 50 μm or less. The bundle of optical fibers 4 shown in FIG. 3 is fabricated by putting the optical fibers together and then fusing the clad portions by heat treatment so as to weld them together. The resultant bundle of optical fibers is shown in plan in FIG. 5. In this figure, numeral 11 indicates the clad portions joined together by fusion welding. The fiber substrate previously described is obtained by sandwiching the above bundle of optical fibers between members of the glass plate 5 and then bonding or fusion-welding the fiber bundle to the glass plate members.

The fiber substrate is formed of the three different materials. For this reason, in case where the surface of the fiber substrate is optically polished, it does not become smooth and inevitably involves some extent of unevenness. This condition will be explained with reference to FIG. 6. FIG. 6 is an expanded view of that part of a fiber substrate in FIG. 7 which is enclosed with mark ○. It is seen from FIG. 6 that a step a appears in the joined area between the glass plate 5 and the bundle of glass fibers 4 and that an unevenness b appears in the fiber bundle. a is approximately 150 nm, and b is approximately 50 nm. The step a and the unevenness b arise even when the optical polishing is carried out with scrupulous care. A concave part in the uneven portion corresponds to the clad, and a convex part to the core. When the photodiode array is disposed directly on such a fiber substrate, drawbacks as stated below are brought about.

FIG. 8 illustrates the portion of the photodiodes on an enlarged scale. The illustrated photo-sensor has the same structure as shown in FIG. 3. As apparent from FIG. 8, the step and unevenness in the fiber substrate cause concave and convex parts in the transparent conductor 6, the semiconductor layer 7 and the metallic electrode 8 which are provided on the fiber substrate. Such concave and convex parts are prone to give rise to the disconnection of the stripe electrodes 6 as well as the metallic electrode 8. In addition, they become a cause for the centralization of electric fields, to make the breakdown voltage of the photodiodes low and to make the dark current high. In this manner, the defect of the smoothness of the surface of the fiber substrate lowers the reliability of the photodiode array drastically and makes the yield of fabrication inferior.

Besides such disadvantages concerning the shape, the fiber substrate has disadvantages as listed below.

(1) Usually, the fiber substrate is washed before forming the photodiode array. In this regard, the fiber substrate is apt to be corroded by a solution of the hydrofluoric acid system which is generally used as a detergent. By way of example, merely by immersing the fiber substrate for 60 seconds in a buffer etchant in which hydrofluoric acid and ammonium fluoride are mixed at a volumetric ratio of 1 to 6, the unevenness (b in FIG. 6) becomes as large as 10 μm, and the fiber substrate cannot be used at all. Therefore, perfect washing is difficult.

(2) In case of forming the transparent conductive film such as $SnO_2$ conductive film 6 on the fiber substrate, it is ordinarily necessary to heat the fiber substrate to about 450° C. The fiber substrate, however, is inferior in the heat resisting property. For example, when it is heat-treated at 450° C. for 30 minutes, the unevenness (b in FIG. 6) becomes about 200 nm. For this reason, a method of forming the $SnO_2$ transparent conductive film at a temperature below 400° C. is required. In general, however, the $SnO_2$ conductive film formed below 400° C. has such disadvantages as inferior conductivity and easy exfoliation. It is accordingly inconvenient for forming the photodiode array.

As described above, the provision of the photodiode array directly on the fiber substrate involves a high possibility that the characteristics of the photodiodes will be degraded. In particular, the available percentage of the photodiode array will be lowered.

SUMMARY OF THE INVENTION

This invention has been made in order to eliminate the disadvantages of the various arts as described above. An object of this invention is to remarkably enhance the smoothness of the surface of a fiber substrate and the chemicals resistance as well as the heat resistance of the fiber substrate, thereby to improve the characteristics of photosensitive elements which are disposed on the fiber substrate and also to raise the reliability of the photosensitive elements. Simultaneously, the photo-sensor of this invention can be fabricated at an extraordinarily high yield.

In order to accomplish the object, the photo-sensor of this invention has a structure as described below. Within a predetermined substrate, a bundle of optical fibers in the form of a sheet as extends from a first surface to a second surface of the substrate is disposed. At least one transparent insulating layer is formed on the end face of the optical fiber bundle as situated on the first surface side of the substrate. An array of photosensitive elements is formed in the main scanning direction and integrally with the substrate in such a manner that the photosensitive elements overlie the end face of the fiber bundle through the transparent insulating layer. The end face of the optical fiber bundle as opens to the second surface of the substrate serves as an information reading face.

DETAILED DESCRIPTION OF THE PREFERRED EMBODIMENTS

This invention may be understood more fully from the following examples.

Figure 3:
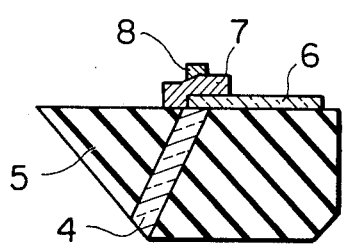
Figure 4:
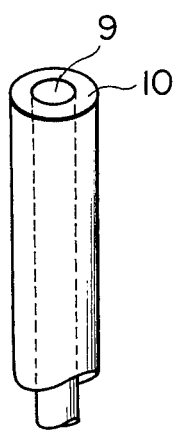
FIG. 4 is a view which shows the structure of an optical fiber.
Figure 5:
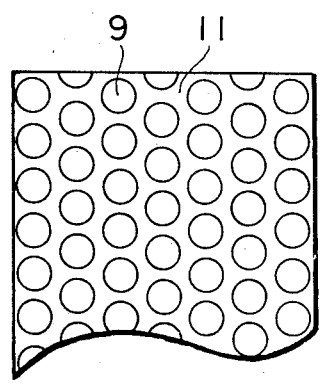
FIG. 5 is a plan view of a bundle of optical fibers.
Figure 6:
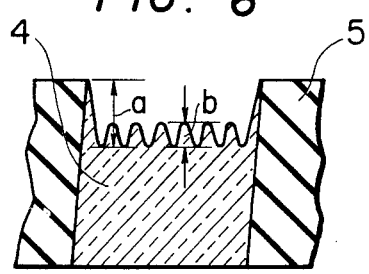
FIG. 6 is a view which illustrates the unevenness of the surface of a substrate with optical fibers buried therein.
Figure 7:
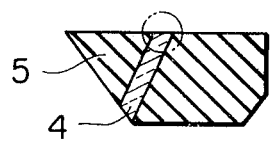
FIG. 7 is a view of the substrate partially depicted in FIG. 6.
Figure 8:
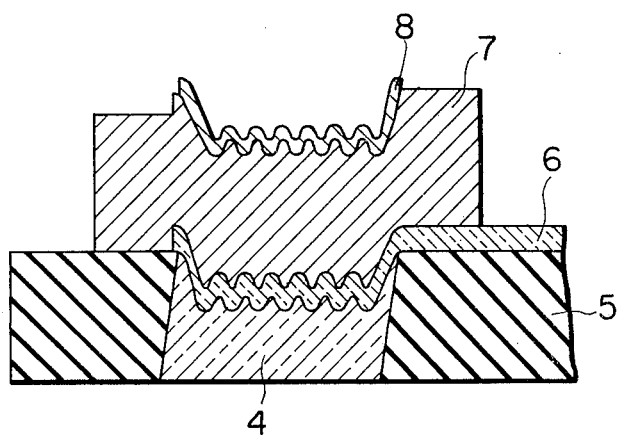
FIG. 8 is a sectional view which shows the structure of a photo-sensor in the case of forming photosensitive elements directly on the substrate in FIG. 7.
Figure 9A:
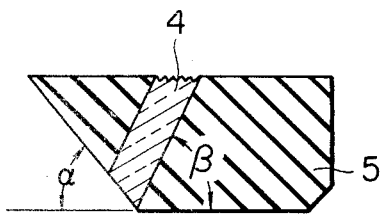
FIGS. 9a-9d are schematic views which illustrate the manufacturing process of a photo-sensor according to this invention.

Description will now be made by reference to the explanatory views of a manufacturing process in FIGS. 9a to 9d. A fiber substrate in which a bundle of optical fibers 4 is buried as illustrated in FIG. 9a is prepared. This fiber substrate is the same as that shown in FIG. 3. Since the surface of the fiber substrate includes steps and uneven parts as described before, they are exaggeratedly depicted. The bundle of optical fibers 4 can be readily fabricated by bonding optical fibers with a resin or the like. Alternatively, it may be fabricated by fusing the clad parts of the optical fibers by heating and then making them integral. In general, a plate 5 may be made of an insulating material which can be easily bonded with the optical fibers. For example, the plate 5 may be the same optical fibers as those 4 as gathered together, or a glass plate or the like. It goes without saying that the material may be made opaque. The thickness of the substrate may be set in conformity with the requirement of the device. In compliance with the request for miniaturization, thicknesses of approximately 2 mm–15 mm are adopted.

A first example of the material of the fiber plate 5 is Glass #9008 (trade name), a product of Corning Inc.

The left end of the fiber substrate illustrated by way of example in FIG. 9a is cut obliquely at an angle α. This serves for effective entrance of light. In general, the angle α is selected from a range of 20–80 degrees, preferably 50–70 degrees. When the angle α is made great, the quantity of entering light increases, but a region which can be read at high resolution becomes small. Conversely, when it is made small, unfavorably, the quantity of entering light decreases. The optical fibers are buried at an angle β with respect to the plane of the substrate. In general, the angle β is selected from a range of 30–80 degrees, preferably 50–80 degrees.

When the angle $\beta0$ is too small, also light scattered from a part other than that part of the original picture which is intended to read (noise component light) enters unfavorably. On the other hand, when the angle $\beta$ is too great, a region which can be read becomes small undesirably.

Figure 9B:
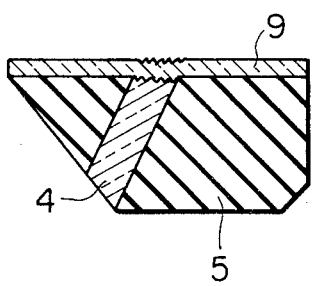
Figure 9C:
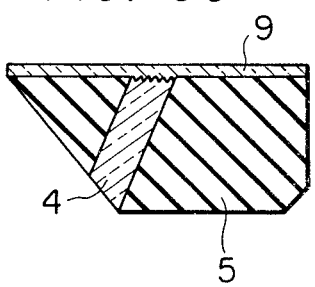

On such a fiber substrate, a glass (for example, E-2 Glass produced by Ohara Optical-glass Manufacturing Co., Ltd. in Japan and containing Si: 70.9 wt-%, Na: 3.8 wt-%, B: 10.64 wt-%, K: 2.5 wt-%) is deposited to a thickness of 1.5 $\mu$m as a transparent insulating layer 9 by the well-known sputtering evaporation process (FIG. 9b). Subsequently, the glass layer 9 is scraped off by 0.5 $\mu$m by the optical polishing (FIG. 9c). Thus, a "fiber plate" is fabricated, and its surface is smooth.

Aluminum oxide ($Al_2O_3$), $SiO_2$ glass, and conventional glasses can be extensively employed for the transparent insulating layer 9. Since tin oxide ($SnO_2$) is often used for a transparent conductive film (6 to be described later) to be formed on the transparent insulating layer 9, the glass should preferably have a softening point of above 600° C. Concretely, suitable examples are E-2 Glass produced by Ohara Optical-glass Manufacturing Co., Ltd. and #7059 Glass produced by Corning Inc. Of course, in the case where the transparent conductive film is formed at a still lower temperature, materials having still lower softening points may be used. In forming the transparent insulating layer 9, such expedients as electron-beam evaporation may well be adopted.

Although the thickness of the transparent insulating layer 9 varies depending on the extent of the underlying uneven parts, it should desirably be at least about 1,000 Å. An excessively thick layer, however, has no merit and rather incurs the degradation of the resolution. In practical use, the thickness is set within approximately 3 $\mu$m. In particular, from the viewpoints of resolution and mechanical strength, values of 2,000 Å–20,000 Å are favorable, and values of 5,000 Å–20,000 Å are especially favorable.

The surface of the transparent insulating layer 9 has the steps and the uneven parts as shown in FIG. 9b under the influence of the surface of the fiber substrate merely by forming the transparent insulating layer by the sputtering or the electron-beam evaporation. As stated above, the steps and the uneven parts can be eliminated by carrying out the optical polishing. The plate which is provided with the transparent insulating layer 9 thus smoothed clean is difficult to be corroded by a detergent of the hydrofluoric acid system. Therefore, the detergent can be used, and the plate can be washed completely. Moreover, the surface of the fiber substrate is covered with the transparent insulating layer 9 and is strengthened, so that even when the fiber plate is heated to the temperature of about 450° C., the uneven parts do not worsen as occurs in the foregoing case. Accordingly, the $SnO_2$ transparent conductive film can be easily formed.

Hereinafter, the plate for placing photosensitive elements thereon shall be termed the "fiber plate."

Figure 9D:
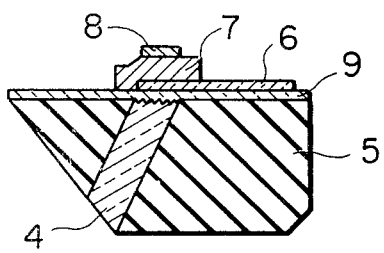

The fiber plate thus prepared is heated to 450° C., and the $SnO_2$ transparent conductive film 6 is deposited thereon by 0.1 $\mu$m by the well-known CVD (chemical vapor deposition) process. At this time, the smoothness of the fiber plate is held as it is because the plate is covered with the glass layer 9. Thereafter, photoresist is applied on the $SnO_2$ transparent conductive film 6. The photoresist is developed and processed into stripes by conventional methods. Using the stripe-shaped photoresist as a mask, the ion-beam etching is executed, whereby the $SnO_2$ transparent conductive film 6 is worked into stripe electrodes of desired shape. An amorphous semiconductor layer of an Se-As-Te system 7 having a thickness of 2 $\mu$m is formed on the stripe electrodes 6 by the mask-deposition. Further, an upper electrode 8 made of a metal film being 80 nm thick is formed on the amorphous semiconductor layer 7 by the mask-deposition (FIG. 9d). Then, the photosensitive elements are formed on the fiber plate.

In this example, a P-N junction is formed by the transparent electrode 6 and the amorphous Se-As-Te semiconductor 7, and it operates as a photodiode.

The photosensitive elements may be formed by depositing CdSe, CdTe and PbS to respective thicknesses of 10 $\mu$m, 2 $\mu$m and 1 $\mu$m instead of the amorphous Se-As-Te semiconductor. All the elements operate as photodiodes. In this manner, any photosensitive material that can be deposited by evaporation is usable.

The construction of the photosensitive element may also be as stated below.

Figure 10:
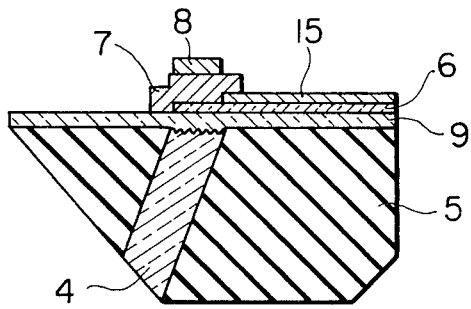
FIG. 10 is a sectional view which shows an embodiment of this invention.

A fiber plate as shown in FIG. 9c is prepared. An $SnO_2$ transparent conductive film 6 is deposited on the surface of the fiber plate to a thickness of 100 nm, and a Cr film 15 is further deposited thereon to a thickness of 100 nm by evaporation. By the conventional photolithography employing photoresist, unnecessary parts of the Cr film 15 are removed to form stripe-shaped electrodes. Subsequently, using the remaining Cr film 15 as a mask, unnecessary parts of the $SnO_2$ transparent conductive film 6 are removed by the ion-beam etching. Lastly, predetermined parts of the Cr film are removed so as to form windows for the entrance of light. Thereafter, the photosensitive elements are formed according to the manufacturing steps described previously. FIG. 10 is a sectional view of the photo-sensor produced by this manufacturing process. The Cr film 15 is useful as a light intercepting film for enhancing the conductivity of the transparent conductive film 6 and for preventing light noises from entering the semiconductor material.

As the transparent conductive film, besides the $SnO_2$ film, there can be employed well-known materials, for example, low-resistance oxide films of $In_2O_3$, $TiO_2$ etc. or semitransparent metallic thin films of Au etc.

Figure 11:
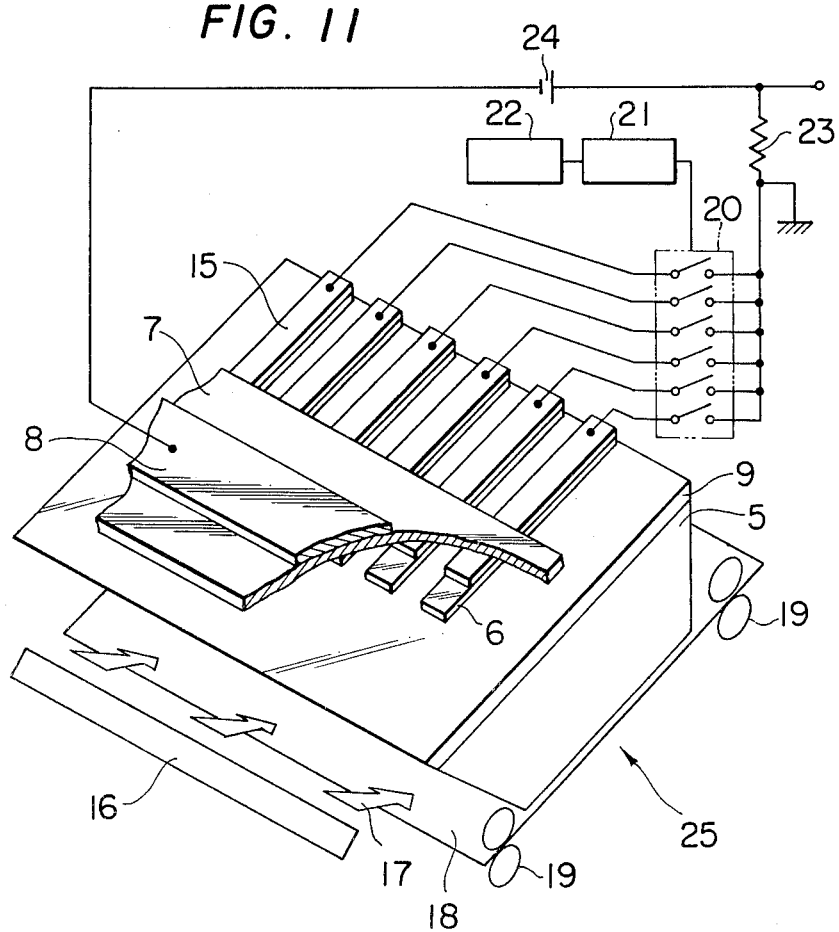
FIG. 11 is a view for explaining the operation of the photo-sensor of this invention.

An example of use of the present photo-sensor will be explained. FIG. 11 is an explanatory view of a device which includes circuitry for deriving signals.

Numeral 25 designates the photo-sensor, numeral 16 an elongated light source for illumination such as tungsten lamp and fluorescent lamp, numeral 17 light from the light source 16, numeral 18 an original picture, and numeral 19 rollers for moving the original picture.

The light 17 from the light source 16 is scattered by the original picture 18, and enters the photosensitive elements through the optical fibers. The original picture can be converted into electric signals by the photosensitive elements. The electric signals are successively taken out of the photosensitive elements by a drive-circuit which is constructed of a switching circuit 20 composed of MOS switching transistors or the like, a shift register 21, and a clock pulse generator 22. Numeral 23 indicates an output resistor, and numeral 24 a d.c. power source.

Figure 1:
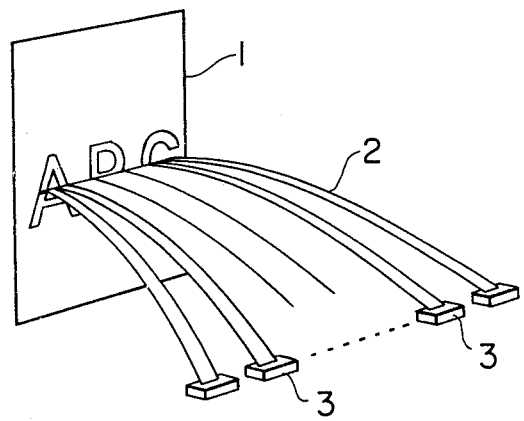
FIG. 1 is an explanatory view of a prior art employing optical fibers.
Figure 2:
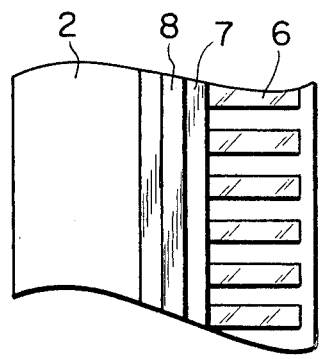
FIGS. 2 and 3 are a plan view and a sectional view, respectively, which show an example of a close contact type photo-sensor employing optical fibers.
Figure 12:
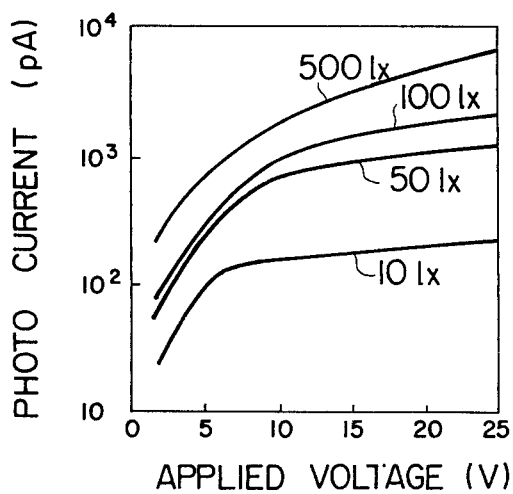
FIG. 12 is a graph which shows the I-V characteristics of the photo-sensor of this invention under illumination.
Figure 13:
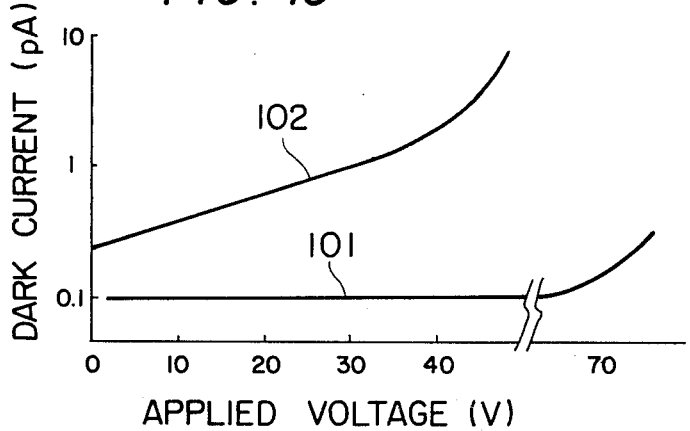
FIG. 13 is a graph which shows the I-V characteristics of the photo-sensor in dark.

Examples of the I–V characteristics of the photo-sensor were as given in FIG. 12. The parameter is the illumination of the original surface. FIG. 13 shows the I–V characteristics in dark, of the photo-sensor according to this invention. Curve 101 indicates the characteristics according to this invention. Curve 102 indicates the corresponding characteristics of the photo-sensor illustrated in FIGS. 2 and 3. It has become apparent that, by adopting the structure of this invention, (1) the dark current can be sharply lowered, (2) the breakdown voltage of the photo-sensor being sharply enhanced. In general, the bias voltage is made 25–30 V. As the photocurrent-to-dark current ratio at this time, a value of ~17,000 or so can be realized under an illumination of 100 lx in accordance with the structure of this invention. On the other hand, the ratio is ~1,700 or so with the foregoing photo-sensor shown in FIG. 3. In this manner, also the photocurrent-to-dark current ratio characteristics can be sharply improved.

Figure 18:
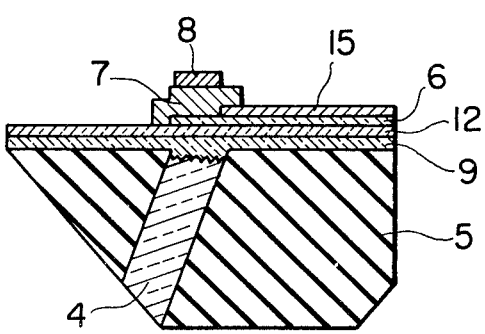
FIG. 18 is a sectional view which exemplifies a photo-sensor employing a fiber plate provided with two transparent insulating layers.
Figure 14:
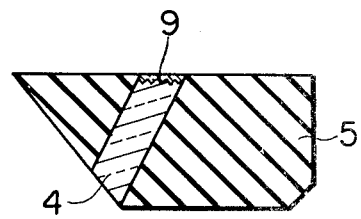
FIGS. 14-17 are sectional views which show different aspects of performance of this invention.
Figure 15:
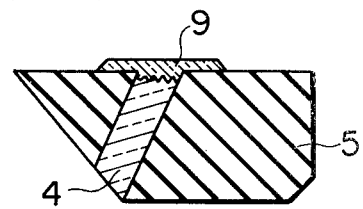
Figure 16:
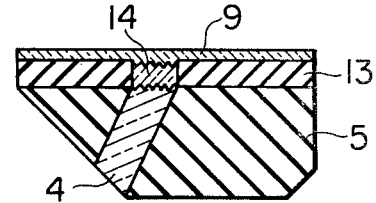
Figure 17:
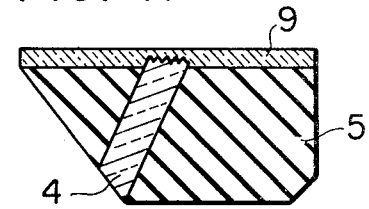

FIGS. 14–17 show different aspects of the fiber plate. It is to be understood that the transparent insulating layer 9 may overlie at least the optical fibers in view of the purpose of the provision thereof. FIG. 14 shows an example wherein the transparent insulating layer 9 is disposed only on the optical fibers 4. FIG. 15 shows an example wherein the transparent insulating layer 9 is disposed on that part of the fiber substrate which includes the upper part of the optical fiber bundle 4. Both the examples can be fabricated in such a way that the sputtering evaporation or the electron-beam evaporation is executed by employing a mask which is open at a desired part, or that a layer of large area is formed, whereupon unnecessary parts of the layer are removed to leave a desired part behind. The fiber plate may, of course, consist of a plurality of portions. FIG. 16 shows an example which consists of two portions. In this figure, numeral 4 designates a first bundle of optical fibers, numeral 5 a first insulator constituting a fiber substrate, numeral 14 a second bundle of optical fibers, and numeral 13 a second insulator constituting a fiber substrate. Integral components are fabricated of the members indicated at 4 and 5, and the members indicated at 14 and 13, respectively. Subsequently, these components are bonded into the fiber plate. Such a plate consisting of a plurality of portions shall also be called the "fiber plate." As in the foregoing, numeral 9 designates a transparent insulating layer. It goes without saying that the layer 9 may be disposed on, at least, the part of the bundle of optical fibers 14. FIG. 17 shows an example wherein a bundle of optical fibers 4 protrudes beyond the upper surface of a material 5 constituting a fiber substrate. Also in this case, the problems can be solved by providing a transparent insulating layer 9 and thus forming the fiber plate. Although typical examples of the fiber plate have been described above, it is needless to say that the invention is not restricted to the illustrated aspects. By way of example, that end face of the optical fibers which is close to the photosensitive elements can be situated on a side surface of the plate. The transparent insulating layer may well be put into layers of a plurality of materials. This will now be explained in detail. For the transparent insulating layer interposed between the fiber substrate and the photoelectric elements, it is desirable to use a material which is difficult to be corroded by chemicals (especially, chemicals of the hydrofluoric acid system), whose softening point is high and on which the $SnO_2$ transparent conductive film can be easily formed. $SiO_2$ glass exhibits a chemicals resistance, has a high softening point, and can be deposited by the electron-beam or sputtering evaporation. It is therefore suitable for this invention. It is disadvantageous, however, in that since it differs from other glasses in the property of chemical adsorption, the formation of the $SnO_2$ transparent conductive film is difficult. It is accordingly desirable that, in case of employing the $SiO_2$ glass, a plurality of layers of the $SiO_2$ glass and another transparent insulating material are formed. As the second transparent insulating material, transparent insulators containing alkaline metals are suitable for this purpose. In practice, glasses are easily used. Such an example is shown in FIG. 18. In the figure, numeral 9 designates an $SiO_2$ glass layer. This layer is formed in such a way that the $SiO_2$ glass is deposited on a fiber substrate to a thickness of 1.5 μm by the electron-beam evaporation or the sputtering evaporation and that the surface is removed by 0.5 μm by the optical polishing so as to smooth the surface. On the $SiO_2$ glass layer 9, the second transparent insulating material other than the $SiO_2$ glass (for example, "E-2 Glass") is deposited to a thickness of 100 nm also by the electron-beam evaporation or the sputtering evaporation. Thus, a transparent insulating layer 12 is formed. In this case, a value of or above 1,000 Å suffices for the thickness of the second transparent insulating layer. The fiber plate thus obtained has the following features:

(1) The smoothness of the surface is good.
(2) The fiber plate is difficult to be corroded by chemicals, especially of the hydrofluoric acid.
(3) The smoothness of the surface is not degraded even at high temperatures. In this respect, the fiber plate is more excellent than in the case of employing the single glass layer.
(4) It is easy to form the $SnO_2$ film which is useful as the transparent conductive film.

The formation of the photosensitive portion on the fiber plate may be done according to the method described before. In FIG. 18, numeral 6 designates an $SnO_2$ conductor, numeral 15 a Cr film, numeral 7 an amorphous semiconductor of the Se-Te-As system, and numeral 8 an upper electrode made of a metallic thin film. The photo-sensor obtained in this way has such excellent characteristics that no disconnection occurs, that the breakdown voltage is high and that the dark current is low.

What is claimed is:

1. A photo-sensor wherein a bundle of optical fibers extending from a first surface to a second surface of a predetermined substrate is disposed within said substrate, an array of photosensitive elements is integrated onto said substrate in such a manner that at least one transparent insulating layer intervenes between the photoelectric elements and an end face of the optical fiber bundle on the first surface side of said substrate, and an end face of said optical fiber bundle located on said second surface of said substrate serves as an information reading face.

2. A photo-sensor according to claim 1, wherein said bundle of optical fibers is in the form of a sheet.

3. A photo-sensor according to claim 2, wherein said bundle of optical fibers is flat.

4. A photo-sensor according to claim 3, wherein an extension of said second surface of said substrate intersects with said information reading face at an acute angle α, an extension of said optical fiber bundle intersects with said information reading face at an acute angle β, and said end face of said optical fiber bundle on the second surface side of said substrate is located in the vicinity of a line of intersection between said second surface of said substrate and a third surface thereof lying on the information surface side.

5. A photo-sensor according to claim 1, wherein said transparent insulating layer is 1,000 Å–30,000 Å thick.

6. A photo-sensor according to claim 4, wherein said transparent insulating layer is 1,000 Å–30,000 Å thick.

7. A photo-sensor according to claim 1, wherein said transparent insulating layer is 5,000 Å–20,000 Å thick.

8. A photo-sensor according to claim 4, wherein said transparent insulating layer is 5,000 Å–20,000 Å thick.

9. A photo-sensor according to claim 1, wherein said transparent insulating layer is made up of layers of a plurality of transparent insulating materials.

10. A photo-sensor according to claim 9, wherein said transparent insulating layer is made up of an $SiO_2$ glass layer and a glass layer which are successively stacked.

11. A photo-sensor according to claim 4, wherein said transparent insulating layer is made up of layers of a plurality of transparent insulating materials.

12. A photo-sensor according to claim 11, wherein said transparent insulating layer is made up of an $SiO_2$ glass layer and a glass layer which are successively stacked.

13. A photo-sensor according to claim 1, wherein said transparent insulating layer is disposed on only an upper part of said optical fiber bundle.

14. A photo-sensor according to claim 4, wherein said transparent insulating layer is disposed on only an upper part of said optical fiber bundle.

15. A photo-sensor according to claim 9, wherein said transparent insulating layer is disposed on only an upper part of said optical fiber bundle.

16. A photo-sensor according to claim 10, wherein said transparent insulating layer is disposed on only an upper part of said optical fiber bundle.

17. A photo-sensor according to claim 1, wherein said transparent insulating layer is disposed in the light path between the upper part of said optical fiber bundle and the photoelectric elements.

18. A photo-sensor according to claim 4, wherein said transparent insulating layer is disposed in the light path between the upper part of said optical fiber bundle and the photoelectric elements.

19. A photo-sensor according to claim 9, wherein said transparent insulating layer is disposed in the light path between the upper part of said optical fiber bundle and the photoelectric elements.

20. A photo-sensor according to claim 10, wherein said transparent insulating layer is disposed in the light path between the upper part of said optical fiber bundle and the photoelectric elements.

21. A photo-sensor according to claim 1, wherein the photosensitive element has at least a body of photosensitive material made by an evaporation method.

22. A photo-sensor according to claims 1 or 4 wherein said photosensitive elements are disposed directly with said substrate in such a manner that transparent electrodes, a photosensitive material layer which is made by an evaporation method, and upper electrodes are stacked over said transparent insulating layer.

* * * * *